United States Patent
Ruelke et al.

(10) Patent No.: US 8,259,858 B2
(45) Date of Patent: Sep. 4, 2012

(54) CARRIER DETECT SYSTEM, APPARATUS AND METHOD THEREOF

(75) Inventors: Charles R. Ruelke, Margate, FL (US); Yadunandana N. Rao, Sunrise, FL (US); Darrell J. Stogner, Plantation, FL (US); Richard S. Young, Weston, FL (US)

(73) Assignee: Motorola Solutions, Inc., Schaumburg, IL (US)

( * ) Notice: Subject to any disclaimer, the term of this patent is extended or adjusted under 35 U.S.C. 154(b) by 531 days.

(21) Appl. No.: 12/512,185

(22) Filed: Jul. 30, 2009

(65) Prior Publication Data

US 2011/0026643 A1    Feb. 3, 2011

(51) Int. Cl.
*H04L 25/06* (2006.01)
(52) U.S. Cl. .................... 375/319; 375/340; 455/324
(58) Field of Classification Search ............... 375/319, 375/332, 340, 345; 455/234.1, 280, 324, 455/334
See application file for complete search history.

(56) References Cited

U.S. PATENT DOCUMENTS

| 5,122,795 | A | 6/1992 | Cubley |
| 7,136,655 | B2 | 11/2006 | Skafidas |
| 2005/0153676 | A1* | 7/2005 | Ruelke et al. ............... 455/324 |
| 2005/0260967 | A1 | 11/2005 | Aytur |
| 2006/0199558 | A1* | 9/2006 | Chiodini et al. ........... 455/234.1 |
| 2007/0072571 | A1* | 3/2007 | Sun et al. ..................... 455/280 |
| 2007/0237264 | A1 | 10/2007 | Huang et al. |
| 2008/0157749 | A1 | 7/2008 | Oung |

OTHER PUBLICATIONS

PCT International Search Report Dated Feb. 17, 2011.

* cited by examiner

*Primary Examiner* — Leon-Viet Nguyen
(74) *Attorney, Agent, or Firm* — Anthony P. Curtis; Daniel R. Bestor

(57) ABSTRACT

A method of detecting an on-channel signal and synchronizing signal detection with correcting for DC offset errors in a direct conversion receiver is presented. A received signal is digitized, and a state machine operates to detect the presence of an on-channel signal. If the signal is not detected, a mixed mode training sequence is initiated in which the DC offset errors in both an analog and digital received signal path are corrected. While training, processing of the digitized samples by a digital signal processor and a host controller is suspended (while they are put into battery save mode) and the gain provided to subsequently received signals is minimized. The DC offset correction circuitry is bypassed and put into battery save mode at predetermined periods when DC offset correction is not performed.

13 Claims, 5 Drawing Sheets

CARRIER DETECT SYSTEM, APPARATUS AND METHOD THEREOF

TECHNICAL FIELD

The present application relates generally to wireless communications and more particularly to a method and apparatus for optimizing a receiver system for detecting the presence of a targeted radio frequency (RF) signal.

BACKGROUND

Existing wireless communications networks, such as a wireless Local Area Networks (LANs), contain a multitude of wireless communication devices (e.g., cellular telephones, personal digital assistants, laptop computers) located within a relatively small geographical area and that simultaneously communicate with the same wireless access point. The devices operate on Radio Frequency (RF) channels, the physical resources over which information is passed between the devices. Generally, in both analog and digital wireless communications, a desired RF signal of suitable frequency is modulated by a modulation signal that represents information, thereby generating a modulated RF signal. The modulated RF signal is transmitted to a radio receiver on the desired or selected RF channel.

When this modulated RF signal is received by a receiver, it is typically processed by the receiver prior to being converted to a digital signal representing the modulated information for further digital processing. This processing of the received RF signal may include combining the received RF signal with a local oscillator (LO) to produce an output signal which is subsequently digitally sampled by an Analog-to-Digital Converter (ADC). The process of combining the received RF signal with a LO signal to produce an output signal is referred to as mixing, down-converting, up-converting, down-mixing, up-mixing or modulating the RF signal with the LO signal. The receiver is a Direct Conversion Receiver (DCR) if the LO frequency is approximately equal to the frequency of the desired received RF signal, and the output signal produced by mixing the RF and the LO signals is a baseband signal (approximately 0 Hz). The receiver is a dual conversion receiver if the LO is offset from the desired received RF signal by an offset frequency typically referred to as an Intermediate Frequency (IF). Dual Conversion receivers typically incorporate additional IF stages to process the IF signal prior to being digitally sampled by the ADC.

Direct conversion receiver (DCR) architectures are generally desirable because they eliminate additional components of intermediate frequency stages, reducing the complexity and cost of the receiver. However, DCRs also suffer from problems that are more easily mitigated by using other types of receivers. One problem that is intrinsic to DCR architectures is baseband DC offset errors or DC distortion effects. Several sources of baseband DC offset errors exist in a DCR; one of which is caused by leakage of the LO signal to the inputs of mixers used to downconvert the RF signals, thereby creating a DC offset error associated with downconversion. DC offsets errors can also be caused by power variations of adjacent channel or off-channel RF signals, creating interference and producing a different DC offset error due to the non-ideality of the mixer.

The total DC offset error encountered is random and may vary depending on the receiver's operating environment, including temperature, changes in supply voltage to the physical circuits, and proximity to off-channel interference signals. The DCR may include circuit blocks that do not function properly in the presence of the undesired baseband DC offset errors. To minimize these DC offset errors, training systems may be incorporated into the DCR that utilize both digital and analog circuits that momentarily configure the DCR to a known training state to achieve optimal post-training performance. One such stage that must have minimum DC offset errors and minimum low frequency distortion to function properly is a Carrier Detect (CD) processing block which functions to detect the presence of a specific RF frequency at weak receive signal power levels.

Accordingly, there is a need for synchronizing a CD processing block with complementary receiver training systems to minimize undesired distortion artifacts while still providing proper processing of the digitized receive samples.

SUMMARY

In various embodiments, a receiver and a reception method are presented, at least in some of which mixed-mode, analog and digital DC offset correction (DCOC) is performed. The following embodiments are provided as summary and may not contain all embodiments of the invention, which is defined by the claims.

The receiver, in one embodiment, comprises a mixer, an analog processing block containing gain and filter stages, an analog-to-digital converter (ADC), a digital processing and formatting (DPF) block, a digital signal processor (DSP), and a host controller. The mixer downconverts an analog signal from a higher frequency to a lower frequency. The analog processing block operates on the downconverted analog signal. The ADC digitizes the signal from the analog processing block. The DPF block processes and formats the digitized signal. The DPF block contains a DC Offset Correction (DCOC) block that provides DC offset correction of residual DC distortion artifacts, a carrier detect (CD) state machine, a DCOC sequence manager that is responsive to the CD state machine and that controls digital training sequences, and a sequence trigger that is responsive to the CD state machine. The DSP demodulates and arithmetically processes the samples from the DPF block. The host controller receives signals from the DSP and adjusts parameters to an earlier stage of the receiver. Processing by the DSP and host controller is suspended and restarted by the sequence trigger depending on whether or not an on-channel signal is detected as having been received by the receiver.

In a further embodiment, the receiver is a direct conversion receiver (DCR).

In a further embodiment, the sequence trigger communicates with the DSP and the host controller through an Interrupt Service Request (ISR) interface between stages of the receiver embedded in the DPF block and the DSP and host controller.

In a further embodiment, the receiver further comprises a serial port interface (SPI) between the DPF and the DSP and host controller, blocks within the DPF configured by the host processor using the SPI to preprogram timer values, bandwidth and gain settings, and sequence configurations.

In a further embodiment, the receiver further comprises a Synchronous Serial Interface (SSI) between the DPF block and the DSP and host controller. In this case, CD state machine status information is communicated to the DSP and host controller over the SSI.

In a further embodiment, the receiver further comprises an adjustable gain amplifier that amplifies an analog signal supplied to the ADC. The adjustable gain amplifier is controlled by an AGC controller and a signal from the DCOC sequence manager dynamically controls the AGC controller. In a further embodiment, when the DCOC sequence manager controls execution of the training sequence, the DCOC sequence manager controls the AGC controller to engage maximum attenuation of the analog signal.

In a further embodiment, the CD state machine contains a transition trigger, a CD feedback sequencer, and a CD algorithm block. The CD algorithm block receives a signal from the DCOC block to determine whether the on-channel signal is present and produces a CD metric that indicates whether the on-channel signal is present. The CD metric is used to execute a sequence through the sequence trigger if the on-channel signal is detected and, through the CD feedback sequencer and transition trigger, initiates the training sequence to train the receiver if the on-channel signal is not detected.

Further, in another embodiment, the CD feedback sequencer initiates the training sequence when the CD metric indicates the absence of the on-channel carrier, when the receiver changes channels, when a device containing the receiver transitions from transmit operation to receive channel monitor, or at protocol-specific Time Division Multiplex (TDM) slot periods having no information for the receiver.

In another embodiment, the transition trigger suspends processing of a received sample by the CD algorithm block and updates suspend timer information into the DCOC block and the CD algorithm block to initiate the training sequence, the suspend timer information containing the period of time during which processing at the DCOC block and the CD algorithm block is suspended, normal processing of the received sample resumes after the period of time defined by the suspend timer has elapsed.

In another embodiment, suspend timer information is able to be different for each block in the receiver having a suspend timer.

In another embodiment, the CD state machine waits until a predetermined hold-off timer has expired after the period of time defined by the suspend timer has elapsed before activating the CD algorithm block to continue normal processing of the received sample.

In another embodiment, the CD state machine waits until a predetermined hold-off timer has expired after the period of time defined by the suspend timer has elapsed before activating the CD algorithm block to continue normal processing of the received sample.

In a further embodiment, the DCOC sequence manager is responsive to the CD state machine and controls mixed mode analog and digital training sequences that serially correct DC offset errors in both an analog and digital received signal path.

In one embodiment, a method of calibrating a CD metric from a CD state machine to a CD metric from a DSP is presented in which the method comprises: determining a first CD metric by processing received samples at the CD state machine, determining a second CD metric by processing received samples at the DSP, comparing the first CD metric to the second CD metric, adjusting processing variables in the CD state machine if the first CD metric is not correlated to the second CD metric within predefined acceptable tolerance limits, regenerating a new first CD metric by the CD state machine and a new second CD metric by the DSP after adjusting the CD state machine processing variables, and continuing to compare the first CD metric to the second CD metric and adjust the CD state machine processing variables until the first and second CD metrics are correlated within the predefined acceptable tolerance limits.

For such an embodiment, a further embodiment comprises putting the DSP into battery save mode after the first and second CD metrics are correlated within the predefined acceptable tolerance limits. This further embodiment may also comprise while the DSP is in battery save mode, continuing to process received samples at the CD state machine to determine if there is a received signal present and reactivating the DSP using an Interrupt Service Request (ISR) trigger signal after a received signal is detected to return the DSP to a normal operating state. Further, after the DSP has entered the normal operating state, the DSP determining an appropriate protocol-specific receiver configuration based on the processing of the received samples.

In one embodiment, a method of detecting carriers in a receiver is presented that comprises: setting a tunable filter to protocol-specific response characteristics, configuring a protocol-agnostic CD algorithmic computation block for processing complex IQ samples from the tunable filter, generating a CD metric from the CD algorithmic computation block, autonomously reconfiguring the receiver for training processes based on the CD metric, performing and synchronizing a selected receiver training process based on the CD metric exceeding a threshold and activating autonomous CD processing after the selected receiver training process has started.

In a further embodiment, the selected receiver training process comprises both an analog and digital training sequence and the autonomous CD processing by the CD algorithmic computation block is enabled after the analog training sequence has been completed.

In a further embodiment, the autonomous CD processing occurs during channel transitions.

In a further embodiment, the reconfiguring is based on the CD metric exceeding a first threshold and the method further comprises selectively activating external processing blocks based on the CD metric falling below a second threshold. Further, the second threshold may be lower than the first threshold.

In a further embodiment, the selected receiver training process comprises a direct conversion (DC) offset correction process.

In a further embodiment, the method further comprises enabling a triggering interface for activating external processing blocks during autonomous CD processing.

In one embodiment, a receiver is presented that comprises: a direct conversion receiver partitioned into a complex in-phase/quadrature phase (I/Q) baseband path, each I/Q baseband path further partitioned into analog and digital complex signaling paths; a mixed analog and digital mode direct conversion (DC) offset correction system with tunable multi-stage filtering configurations; a protocol-agnostic carrier detect (CD) computation block with variable parameters adjustable to specific protocols and channel conditions; a synchronization control block configured to enable CD computations after a combination of mixed mode DC offset correction sequences is completed; a feedback loop in which CD activation reconfigures DC offset correct topology and loop parameters for receive operation; and a priority Interrupt Service Request (ISR) interface configured to disable digital signal processing and host processing during DC offset correction and enable digital signal processing and host processing when DC offset correction is not being applied.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present application.

Figure 1:
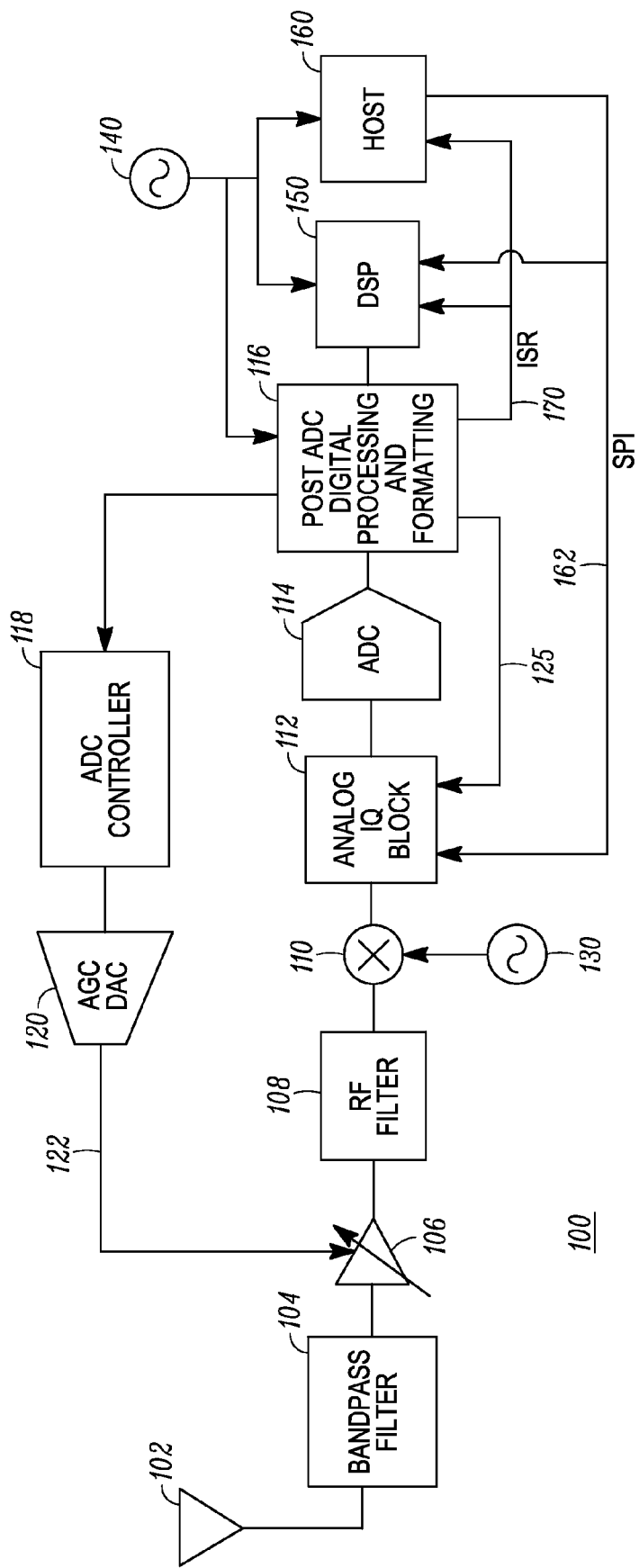
FIG. 1 illustrates one embodiment of a block diagram of a receiver for processing a radio frequency (RF) signal.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

The following detailed description is merely exemplary in nature and is not intended to limit the invention defined by the claims or the application and uses of such invention. Furthermore, there is no intention to be bound by any expressed or implied theory presented in the preceding technical field, background, brief summary or the following detailed description. As used herein, the word "exemplary" means "serving as an example, instance, or illustration." Any embodiment described herein as "exemplary" is not necessarily to be construed as preferred or advantageous over other embodiments. The terms "substantially", "essentially", "approximately", "about" or any other version thereof, are defined as being close to as understood by one of ordinary skill in the art. The term "coupled" as used herein is defined as connected, although not necessarily directly and not necessarily mechanically. A device or structure that is "configured" in a certain way is configured in at least that way, but may also be configured in ways that are not listed. An element "configured to" perform a particular function contains the circuitry and programming to execute the function. All of the embodiments described in this Detailed Description are provided to enable persons skilled in the art to make or use the invention and not to limit the scope of the invention, which is defined by the claims.

Various embodiments described herein provide a method and an apparatus for proper Carrier Detect (CD) system operation through integrating the CD system with ancillary training systems that configure the receiver for optimum processing of radio frequency (RF) signals. Trigger signals associated with mixed mode, multi-tiered DC offset correction and associated automatic gain control (AGC) control sequences are generated and then applied as feed-forward signals to an autonomous CD block to ensure proper algorithmic processing and associated generation of a CD decision metric using undistorted samples of the received signal. Generally, the CD block performance is related to the magnitude of the DC offset errors and frequency distortion; the higher the baseband DC offset error, the more degraded the CD block performance in detecting an actual on-channel received signal. The CD block detects the presence of an on-channel RF signal at weak receive signal power levels. Synchronization of the CD block with the complementary receiver training system is a delicate process in which undesired distortion artifacts are minimized while proper processing of the digitized receive samples is still provided.

The CD decision metric is used as a feedback signal to training systems within the receiver to ensure that the training is not coincident with receiving an on-channel RF signal. The training systems contain both digital and analog circuits that configure the receiver to a known training state to achieve optimal post-training performance. In addition, Interrupt Service Request (ISR) signals are generated by the CD system to provide internal CD status information to digital processing systems external to the receiver. Such processing systems include a Digital Signal Processor (DSP) and/or host controller. The ISR signals are used to schedule radio maintenance subroutines to optimize receiver processing and enable/disable protocol-specific demodulation algorithms, as well as optimize processor power management strategies (i.e., minimize overall receiver and host processor power consumption).

FIG. 1 illustrates a general block diagram of a receiver. The receiver 100 contains blocks (also called stages) that process a received RF signal to generate an in-phase (I) intermediate frequency (IF) signal and a quadrature-phase (Q) IF signal. Although the following description refers to a direct conversion receiver (DCR), depending on the frequency difference between the desired RF signal and the Local Oscillator (LO) frequency used to mix the received RF signal, the receiver 100 may be a DCR, a very low IF (VLIF) or a Super Heterodyne Dual Conversion (SHDC) incorporating CD processing functionality.

In the embodiment illustrated in FIG. 1, the receiver 100 is a direct conversion receiver (DCR). As shown, an RF signal is received by an antenna 102 of the receiver 100 and provided to a pre-selector filter (bandpass) 104. The pre-selector filter 104 is a bandpass filter that rejects spurious out-of-band RF signals. The filtered RF signal resulting from the bandpass filter 104 is passed into a low noise amplifier (LNA) 106 of adjustable gain which amplifies the filtered RF signal. The LNA 106 incorporates automatic gain control for adjusting the gain of the LNA 106 so as to set the amplifier output signal proportional to changes in the AGC control voltage 122. The amplified RF signal may then again be bandpass filtered (using a second preselector RF filter 108). The second RF filter 108 also serves to attenuate undesired spurious RF signals that can interfere with proper processing of the desired RF signal.

The filtered analog signal from the second RF filter 108 is provided to a mixer 110, which mixes the filtered analog signal with a local oscillator (LO) signal from an LO 130 to generate an intermediate frequency (IF) signal at the output of mixer 110. The mixer 110 down-converts the RF signal to an IF signal composed of baseband in-phase (I) and baseband quadrature-phase (Q) signals. Only one of the quadrature signal paths is shown in FIG. 1 for convenience.

The IQ signals, that together comprise the IF signal from mixer 110, are subsequently processed in analog IQ processing block 112 through a series of gain and filter stages to further increase the signal level of any desire RF signal relative to the ambient noise of the receiver system. The ratio of the desired received signal to the ambient noise is referred to as the Signal-to-Noise Ratio (SNR) of the desired received signal. As described above, the analog IQ baseband signals may exhibit undesired distortion including low frequency noise and direct current (DC) offset errors within the common mode voltages due to non-ideal behavior of the mixers and subsequent analog IQ processing block 112. Given that digital symbols are selected to represent the received signal at specific intervals in time on the basis of a voltage level of the demodulated signal, the introduction of sufficiently high DC offset errors can cause incorrect selection of said digital symbols. As each sample representing the IQ-modulated signals contains two symbols, one symbol for the in-phase I signal, and one symbol for the companion quadrature-phase Q signal, an erroneous identification of one or both symbols results in the symbol pair (00, 01, 10, 11) being incorrectly determined. Even if error correction logic is subsequently applied in the receiver, such correction may not be able to compensate for the corruption of the IQ sample pair.

Turning back to FIG. 1, after increasing (e.g., maximizing) the SNR of the received analog signal, the analog IQ baseband signal from the analog IQ processing block 112, including both desired baseband IQ signals and the undesired distortion artifacts, are subsequently digitized by an Analog-to-Digital converter (ADC) 114. The ADC block 114 samples the baseband analog signal at a predefined sample rate to produce digitized baseband signals. The digitized baseband signals are then processed by a post ADC digital processing and formatting block 116. In the post ADC digital processing and formatting block 116, various digital sub-stages are used to process and format the digital signals for conveyance to subsequent digital sub-stages. The post ADC digital processing and formatting block 116 is described in more detail with reference to FIG. 2, and may include at least one decimation block for changing a first input sample rate to a second output sample rate, at least one Finite Impulse Response (FIR) and Infinite Impulse Response (IIR) filters, and a formatting block that arranges the processed samples of the IQ analog signals into a predefined format. The post ADC digital processing and formatting block 116 also controls the gain of the analog IQ processing block 112, also as described in more detail with reference to FIG. 2.

The properly-formatted digital samples resulting from the post ADC digital processing and formatting block 116 are provided to a Digital Signal Processor (DSP) 150 for demodulation and subsequent arithmetic processing. The signal from the DSP 150 is provided to a host controller (processor) 160 and eventually to an output audio section (not shown). The host controller 160 may adjust parameters to one or more stages of the receiver 100, including the analog IQ processing block 112, post ADC digital processing and formatting block 116 and the DSP 150, via a serial port interface (SPI) 162. The post ADC digital processing and formatting block 116 generates DCOC signal 125 to optimize the analog portion of the receiver so as to ensure proper receive operation. The post ADC digital processing and formatting block 116 is also able to interrupt processing of the DSP 150 using an Interrupt Service Request (ISR) 170. The ISR, which is an interface between the CD stages embedded in the post ADC digital processing and formatting block 116 and the DSP/host processor, is described in greater detail in FIG. 2. The ISR ensures various maintenance routines, intended to optimize receiver processing, are properly scheduled while minimizing overall receiver and host processor power consumption. A reference clock signal is provided by a reference oscillator (also referred to as a clock) 140, which is used by various stages within receiver 100 to ensure synchronous processing of digital samples without loss of information.

As shown, the receiver 100 includes closed loop feedback and feed-forward systems that operate on information available at one point in the receiver to control a particular block or blocks located in one or more different sections of the receiver. One feedback system illustrated in FIG. 1 is the AGC control loop. Digital signals indicating the signal strength of the received signal are provided to an AGC controller 118 from the post ADC digital processing and formatting block 116. The AGC controller 118 determines whether to adjust the gain setting of at least one of the preceding gain stages by comparing the received signal level to a series of predefined thresholds. If the AGC controller 118 determines that a gain adjustment is needed, the AGC controller 118 changes the digital word programmed into an AGC Digital-to-Analog converter (DAC) 120, which is coupled to the adjustable LNA 106. The AGC DAC 120 in turn changes an analog AGC control voltage 122 supplied to the LNA 106 to a different value. The change in AGC control voltage 122 adjusts the gain of the LNA 106 to thereby change the analog signal level from the LNA 106 to meet the predefined threshold requirements.

Figure 2:
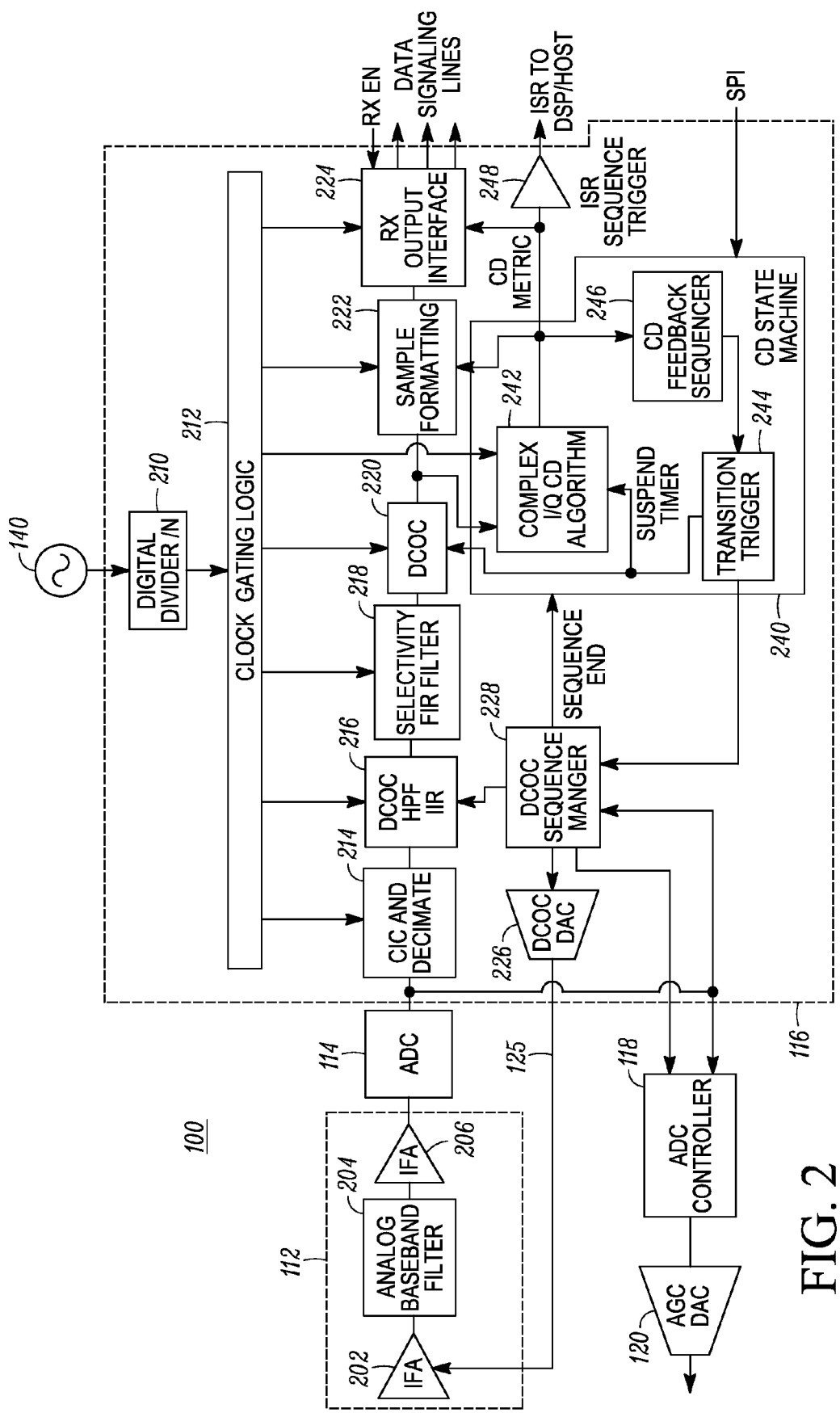
FIG. 2 illustrates an embodiment of a detailed block diagram of some of the sections of the receiver of FIG. 1.

FIG. 2 illustrates the CD stage (carrier detect system apparatus 200) in relation to ancillary systems embedded in the receiver 100. Specifically the analog IQ processing block 112, and post ADC digital processing and formatting block 116 are illustrated in greater detail in FIG. 2 than in FIG. 1. An analog signal is supplied to the input of the receiver 100 (the antenna is not shown for convenience), and is provided to the analog IQ processing block 112. The analog IQ processing block 112 contains multiple gain and filter stages, including a variable gain Intermediate Frequency Amplifier (IFA) 202, a filter (tunable low pass filter LPF) 204, and a buffer 206. The gain and filter stages of the analog IQ processing block 112 maximize the SNR of the received signal. The analog signal is amplified by the IFA 202 before being provided to the LPF 204. The LPF 204 allows baseband frequencies, e.g. typically below about 10 kHz for an RF channel spacing of 25 kHz, to pass through. The filtered analog signal is then buffered by the buffer 206. The IFA 202, in addition to merely amplifying the received analog signal, serves as a summing junction for a DC offset correction (DCOC) signal 225. The DCOC signal 225 is adjusted to minimize the DC offset error present in the analog IQ signal at the ADC block 114 input. ADC block 114 can adopt any configuration that meets the receiver's noise, linearity, and dynamic range requirements, such as a Discrete Time Sigma Delta (ΣΔ) ADC. The digital processing and formatting block is described in more detail below.

As described in reference to FIG. 1, the analog IQ signal comprising the IF frequency output from mixer 110 of FIG. 1 is sampled at a predefined sample rate at ADC block 114, which serves to digitize the analog signal for further processing in the post ADC digital processing and formatting block 116. The post ADC digital processing and formatting block 116 is composed of a number of digital sub-system blocks. The output signal from ADC block 114 is a series of digital samples representing the analog IQ IF signal that is further processed by a Cascaded-Integrator Comb (CIC) Filter and Decimate-by-N (or decimation) block 214. The CIC filter and decimation block 214 functions as an anti-aliasing filter during decimate-by-N operations that change the sample rate of the discrete-time samples received from ADC block 114. The output sample rate of the CIC filter and decimation block 214 has been reduced by an integer multiple N of the input sample rate from ADC block 114. The filter in the CIC filter and decimation block 214 may be of any order, such as a $5^{th}$ order filter.

Following decimation block 214, the samples of the digitized IQ IF signal are further processed by several filters including an Infinite Impulse Response (IIR) filter 216 and IQ selectivity Finite Impulses Response (FIR) filter 218, as well as a precision IQ DC Offset Correction (DCOC) block 220. IIR Filter 216 operates on input data sample-by-sample to produce a High-Pass-Filter (HPF) response thereby minimizing any residual DC offset errors not removed by the analog IQ DCOC signal 225. The IIR filter 216 is incorporated into a mixed mode DCOC training sequence controlled by the DCOC sequence manager 228. The FIR filter 218 provides channel selectivity for the desired on-channel signal, attenuating undesired off-channel signals. The DCOC block 220 operates on samples after FIR filter 218 to provide precision high resolution, modulation-specific DC offset correction of any residual DC distortion artifacts not eliminated by DCOC signal 225 or IIR filter 216.

The output samples of the DCOC BLOCK 220 are subsequently formatted at the SSI Sample Formatting block 222 for communication to external devices, e.g., the DSP 150, via the Receiver (Rx) Output Interface block 224. The Rx Output Interface block 224 has multiple data signaling lines to communicate the IQ samples to external device(s). The signals for the data signaling lines are enabled by asserting a Receive Enable (Rx En) input to the Rx Output Interface block 224 to indicate that the external device(s) that are connected to the data signaling lines are awaiting the sampled data from the Receiver (Rx) Output Interface block 224.

Each processing stage in the post ADC processing and formatting block 116 is clocked at a rate that is divided down from the reference oscillator 140 by a divider network 210. The divider network 210 has one or more dividers that provide the appropriate clock signals for proper processing of the sampled data at the particular digital stage. The divided down clock signal(s) from the output of divider network 210 are distributed to the appropriate digital processing stages by clock gating logic 212. The clock gating logic 212 maintains proper synchronicity between the digital stages, indicating to each particular digital stage the time at which data from a preceding stage is ready for further processing, and ensures that the appropriate clock signal is routed to the digital blocks.

The post ADC digital processing and formatting block 116 also includes a CD state machine 240. The CD state machine 240 has multiple digital processing blocks, including a Complex IQ CD Algorithm block 242, a transition trigger block 244 and a CD feedback sequencer block 246. The complex IQ CD algorithm block 242 operates on a sampled analog IQ IF signal from the DCOC BLOCK 220 to determine whether an on-channel signal is present. An example of the manner in which the complex IQ CD algorithm block 242 operates may be found in U.S. patent application Ser. No. 12/257,672, filed, Oct. 24, 2008 and entitled "Method and Device For Detecting The Presence Of A Carrier Signal In A Received Signal," which is herein incorporated by reference in its entirety. The CD algorithm block 242 is protocol-agnostic and produces a CD metric that indicates whether or not the on-channel signal is present.

An on-channel signal is determined to be present if the CD metric exceeds a predefined threshold. Generally, once the CD metric exceeds a first threshold indicating that there is a carrier present, a Carrier Detect (CD) flag set signal (refer to signal 312 of FIG. 3) is activated. When the CD flag set is activated, the CD metric is used to execute the ISR sequence through an ISR sequence trigger 248 or through the SSI or SPI interface. The CD flag set activation is maintained until the CD metric falls below a second threshold. The second threshold is usually set equal to or less than the first threshold, thereby defining carrier detect hysteresis for the CD State Machine 240. The carrier detect hysteresis is SPI programmable. The hysteresis prevents uncontrolled "toggling" of the Carrier Detect indicator at threshold conditions. When the CD metric from CD algorithm block 242 indicates the absence of the on-channel signal however, the CD feedback sequencer block 246 may initiate ancillary receive training sequences designed to train the receiver for optimum processing of the received signals.

The CD feedback sequencer block 246 initiates the training sequence by signaling to the transition trigger block 244 an appropriate time to transition the receiver 100 to a training mode. An appropriate time for training the receiver may be, for example, periods when the CD metric indicates an absence of an on-channel carrier, when the receiver changes channel spacing settings, a transition from one receive channel to a different receiver channel, when the device containing the receiver transitions from transmit operation to receive channel monitor, or protocol-specific Time Division Multiplex (TDM) slot periods having no information for the receiver 100.

To transition the receiver into a training mode, the transition trigger block 244 suspends processing of a received sample by the IQ CD algorithm block 242 and updates suspend timer information into the DCOC BLOCK 220, CD algorithm block 242, and/or other digital blocks as desired. The suspend timer sets the period of time during which processing at the DCOC block 220 and the CD algorithm block 242 is suspended. The suspend timer value may be different for different blocks.

After the time defined by the suspend timer has elapsed for a given digital sub-block in the post ADC digital processing and formatting block 116, normal processing of the sampled receive signal resumes. This prevents processing of samples that may be corrupted by ongoing receiver training sequences. Once the suspend timer has been updated, and processing of sampled receive data is suspended, a training sequence may be triggered by the transition trigger block 244 initiating a training sequence using an ancillary training system indigenous to the receiver system. In this way, the CD state machine 240 may not actually set the control parameters of a given training sequence, but the CD state machine 240 may determine when a sequence is initiated as well as the operational status of at least some of the digital blocks during any given training sequence.

As illustrated in FIG. 2, the transition trigger block 244 triggers a DCOC training sequence using the DCOC Sequence Manager 228. The DCOC Sequence Manager 228, in turn, iterates through a predefined training routine that includes tuning a DCOC DAC 226 to set the analog IQ DCOC signal 125 to minimize DC offset errors in the analog IQ processing block 112. Following optimization of the analog IQ processing block 112, the DCOC Sequence Manager 228 continues the DCOC training routine by sequencing the IIR filter 216 through a series of predefined (protocol-specific) Bandwidth (BW) settings for predetermined times to further minimize the undesired DC offset errors. The DCOC Sequence Manager 228 itself may control other indigenous receiver systems during the DCOC training routine, including the AGC controller 118. When the DCOC Sequence Manager 228 is executing the DCOC training routine, the AGC controller 118 is configured to engage maximum attenuation of the received RF signal by setting the AGC DAC 120 to output a control voltage correlating to maximum attenuation of LNA 106 (shown in FIG. 1), in essence blocking any received input signal.

Once the DCOC Sequence Manager 228 has finished the DCOC training sequence, it generates a Sequence End signal to the CD State Machine 240 to indicate the termination of the DCOC training sequence. Once the Sequence End signal is received, the transition trigger block 244 triggers the suspend timer counter for the DCOC BLOCK 220 and the complex IQ CD algorithm block 242.

In general, the CD state machine 240 processes received samples after the FIR filter 218 so that the presence of off-channel signals does not prevent proper detection of desired on-channel signals by the CD algorithm block 242. In addition, the CD state machine 240 processes sampled received signals from the DCOC block 220 so that undesired low level DC offset errors are not falsely interpreted as on-channel signals by the CD algorithm block 242, resulting in a false indication that a desired signal is present when in fact no such signal is being received. The CD state machine 240 is connected to the blocks in the feed-forward signal path after the DCOC block 220 and selectivity FIR filter 218, but before the DSP 150 and host controller 160, which increases the system flexibility and improves performance for the reasons provided above.

The CD state machine 240 also controls multiple ancillary systems that train the receiver for proper processing of received signals. The ancillary training systems controlled by the CD state machine 240 includes, but may not be limited to, the ISR sequence trigger 248, the DCOC Sequence Manager 228, the DCOC block 220 and the SSI Sample Formatting and Rx Output Interface blocks 222 and 224 respectively. All blocks within the post ADC digital processing and formatting block 116 are configured by the host controller 160 (shown in FIG. 1) using the Serial Port Interface (SPI) to preprogram timer values, bandwidth and gain settings, and sequence configurations. However, once the post ADC Digital Processing and formatting Block 116 is configured, autonomous control of event-initiated training sequences may be maintained by internal logic blocks such as the CD state machine 240 and the DCOC Sequence Manager 228. The CD state machine 240 is protocol-agnostic, which means that the CD state machine can be adjusted to facilitate proper detection of an on-channel RF signal without regard to how the RF signal is modulated. Specifically, parameters affecting the Complex IQ CD algorithm block 242 can be adjusted to account for any given modulation strategy, channel spacing or timing requirements as may be dictated by the specific protocol governing the RF channel.

The post ADC digital processing and formatting block 116 may be bypassed and all associated digital circuits such as those shown in FIG. 2 put into battery save. In one embodiment, putting the post ADC digital processing and formatting block 116 into battery save mode does not reset the registers or operating state, but simply terminates digital processing of the IQ samples. Terminating processing of digital samples without resetting a digital block's registers is defined as suspend mode or suspend function for that digital block. Alternatively, all registers and operating states in the post ADC digital processing and formatting block 116 can be separately reset upon receiving a reset signal from the host controller 160, even when operating in normal receive mode. A digital block is in reset mode or reset function when all registers associated with that block are set to a predefined, known state and digital processing of received samples by that block are terminated. The reset signal to the post ADC digital processing and formatting block 116 can be sent via a dedicated reset line from the host (not shown), or using the SPI input shown in FIG. 1. In this case, a CD reset signal from the host controller 160 causes the carrier detect registers and timers to be reset, thereby reinitiating the digital processing from a known start-up initial condition. When the post ADC digital processing and formatting block 116 is enabled, it continuously processes I/Q data, and a logic signal becomes available to the SSI Sample Formatting block 222 to indicate the status of the carrier detect over the SSI interface. In one embodiment, if the post ADC digital processing and formatting block 116 determines that a carrier is present, then the CD logic signal to the SSI Sample Formatting block 222 is high; however, if the carrier detect block does not detect a signal, then the CD logic signal to the SSI Sample Formatting block 222 is low.

In one embodiment, the bit precision of the CD digital section is at least 3 bits below the minimum required Least Significant Bit (LSB) resolution of the ADC block 114. This minimizes round-off errors that can false CD metrics at threshold sensitivity levels. For example, while the receiver system requirements may necessitate 16 bits of resolution from the ADC block 114, with each bit representing 80 uV/bit, the digital processing of the I/Q data by the post ADC digital processing and formatting block 116 is 19 bit precision. However, all calculations within the carrier detect block will use only the 16 Least Significant Bits of the 19 bit input data, resulting in a bit resolution of 10 uV/bit for the CD State Machine 240.

In general, as described with reference to the timing diagrams of FIG. 3, the CD state machine 240 synchronizes algorithmic processing with other support blocks. This allows the CD algorithm block 242 to process complex samples after a mixed mode DC offset correction sequence (containing both analog and IIR correction sequences) while ensuring that anomalous transient response are not incorporated into the CD processing. A hold off timer marks the beginning and the termination point of any DCOC processing, along with associated AGC actuation. For the duration of the mixed mode DCOC, as long as a "Mixed Mode" (MM) logic indicator is held high and the CD state machine 240 is enabled, the CD calculations are "suspended" (not reset). Once the MM logic is low, the CD algorithm block 242 resumes after a predetermined number of "hold off samples" have been passed thru the post ADC digital processing and formatting block 116. The number of offset samples is SPI programmable.

Figure 3:
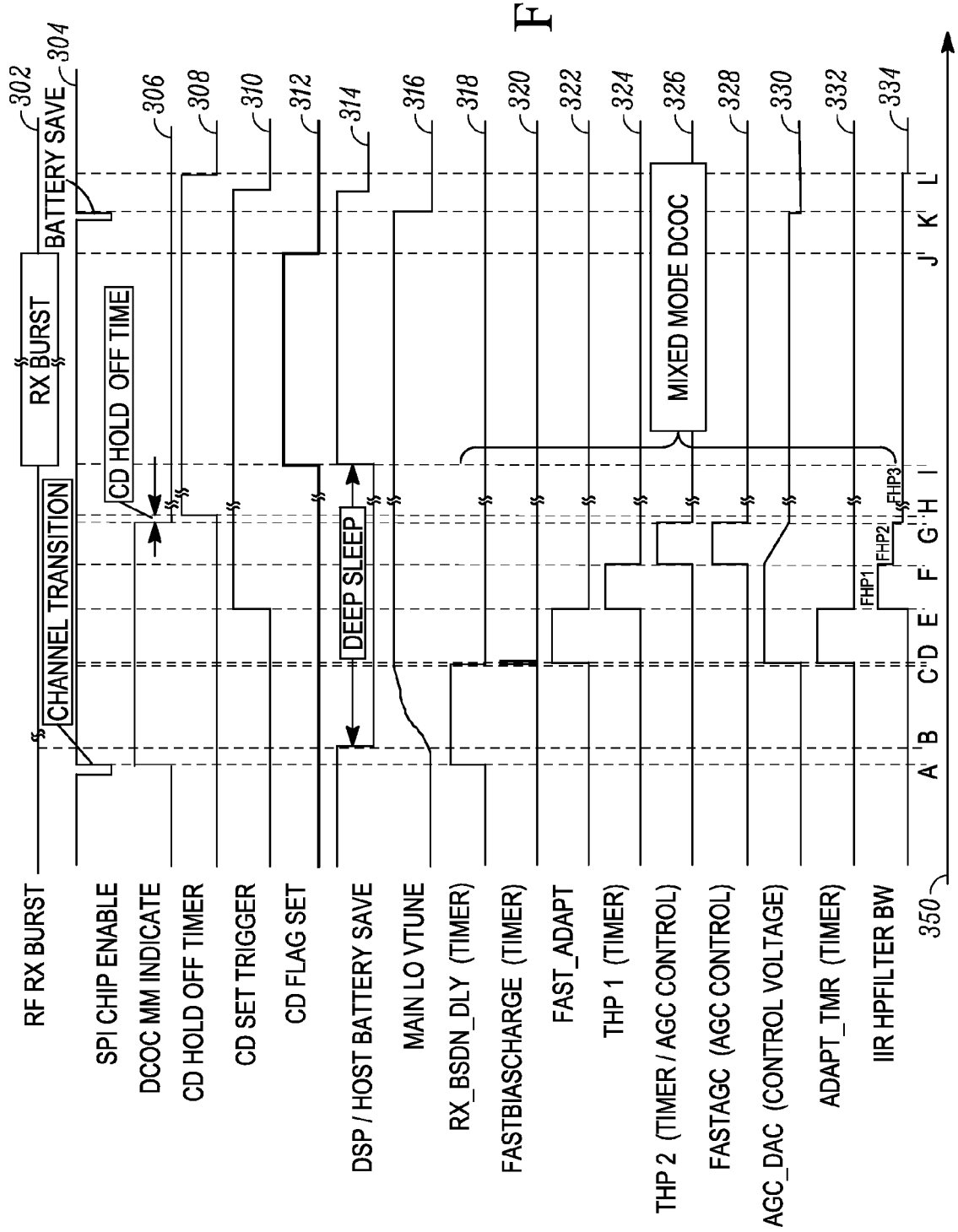
FIG. 3 illustrates an embodiment of a timing diagram of signals in the receiver of FIG. 1.

FIG. 3 illustrates a timing diagram illustrating the interrelationship between the CD state machine 240 control signal timing and ancillary DCOC sequence manager timing signals within DCOC Sequence Manager 228. In FIG. 3, the x-axis 350 shows the relative time of events "A" through "K" corresponding to state transitions for internal timing signals 302 through 334 within the CD system apparatus 200. Specifically, FIG. 3 shows the timing events within the CD system apparatus 200 that precedes receiving a receive burst (Rx burst) 302. It should be emphasized that these timing events are given for illustrative purposes only, and that any given single event or multiple events shown in FIG. 3 may be modified or even eliminated. It should also be noted that the duration of each timing event may be predetermined or may be programmable through the SPI 162 or through other programming means.

Prior to receiving the Rx burst 302, the DCOC sequence manager 228 initiates a mixed mode DCOC sequence illustrated by timing events 318 through 334. The mixed mode DCOC sequence is a DC offset correction sequence that serially corrects DC offset errors in both the analog and digital received signal path. It should be noted that alternative DCOC strategies may be substituted for the mixed mode DCOC described herein, including analog domain or digital domain DCOC. An analog domain DCOC occurs when only the analog signal path DC offset errors are corrected, while a digital domain DCOC occurs when the DC offset error is corrected using post ADC digital samples of the analog signal.

As mentioned previously, the DCOC sequence is initiated prior to initializing the CD state machine trigger so as to mitigate false carrier detect indications due to DC offset errors. In FIG. 3, the mixed mode DCOC is triggered by a SPI Chip Enable (CE) de-assert pulse 304 corresponding to event "A" on the time axis 350. The DCOC sequence begins at the end, (e.g.: rising edge) of the relatively short SPI CE pulse 304. Once a DCOC has been triggered, the DCOC sequence manager 228 manages the correction as a series of timed events within the DCOC training. This series of events includes a Receive Baseband Delay (rx_bsnd_dly) timer 318 and a Fast Bias Charge (fastbiascharge) timer 320. The Receive Baseband Delay timer 318 sets the delay for the LO 130 to resume proper operation from a previous state, such as battery save mode or channel change, and may be followed by Fast Bias Charge timer 320 which sets the delay for the mixer bias circuitry to stabilize once the LO signal is present. The LO control voltage response is illustrated by the Main LO $V_{tune}$ timer 316, which shows the LO control voltage being tuned for proper operating frequency during the Receive Baseband Delay timer 318. The termination of the Receive Baseband Delay timer 318 and Fast Bias Charge timer 320 correspond to events "C" and "D" respectively on time axis 350, and are relatively close in time. Since the receiver system does not process a signal received at the system antenna during the DCOC training, selected processors used to process sampled receive signals may be put into a battery save mode during the logic low state of a DSP/host Battery save signal 314 initiated at event "B" on time axis 350. The blocks used during processing of a receive signal may remain in battery save mode for an indeterminate period of depending on when the Rx burst is received. Generally, the longer the selected processors are in this mode, the lower the overall receiver system power consumption.

After the Fast Bias Charge timer 320 has expired at event "D," the receiver AGC attenuation is set to maximum attenuation. This is illustrated in FIG. 3 as an AGC control signal (agc_dac) 330 (control voltage 122 to LNA 106 FIG. 1), and prevents processing of any signal that may be present at the receiver's antenna. Synchronous with the AGC control signal 330 assertion of maximum AGC attenuation, a Fast Adapt timer 322 (fast_adapt) is initiated. The Fast Adapt timer 322 sets the duration of the analog portion of the DC offset correction sequence. The termination of the Fast Adapt period 322 delineates the end of the Analog portion of the mixed mode DCOC and is designated as event "E" on time axis 350.

Following the completion of the Analog DCOC portion of the mixed mode DCOC sequence at the end of signal 322, the digital DCOC sequence is initiated. The digital DCOC sequence contains a series of High Pass Filter (HPF) bandwidth (BW) settings for the IIR filter 216 adjusted in sequence so as to minimize the DC offset error represented in the digital samples of the received signal. The sequence of IIR BW settings is represented by the IIR_hpfilter_BW signal 334. The first BW setting FHP1 is set for a time duration determined by a first high pass (HP) timer (thp1) 324. The second IIR_hpfilter_BW setting FHP2 is set for a duration determined by a second HP timer (tph2) 326. The end of the first and second HP timer periods 324, 326 are denoted as events "F" and "G" respectively on the time axis 350.

The final IIR_hpfilter_BW setting, FHP3, is maintained continuously following the end of thp2 period 326. Synchronous with the beginning of the second HP timer 326 at event "F," the AGC controller 118 is configured for fast AGC attack operation in which the AGC attenuation begins to be removed. The duration of the fast attack AGC response is determined by a Fast AGC Attack (fastagc) timer 328, during which the AGC control signal 330 is adjusted for proper attenuation any received signals that may be present at the receiver antenna. In the instant example, the AGC adjustment is completed by the end of the second HP timer 326. It should be noted that the timing relationship between any given signal period may be adjusted to minimize DC offset errors at the time "G." For example, the Fast AGC Attack timer 328 delineating the period during which the AGC control signal 330 is adjusted may be initiated at the end of the second HP timer period 326 event "G," or may begin at the beginning of the first HP timer period 324 event "E". In addition, the Fast AGC Attack period 328 may span part or all of the first and second HP timer periods 324, 326 or be extended to relative time beyond event "g" as desired to minimize DC offset error. Generally, the mixed mode DCOC sequence is said to have been completed at event "G" on time axis 350.

Synchronous with the mixed mode DCOC, the CD state machine 240 initializes its internal blocks to commence processing of the sampled received signals following successful completion of the DCOC sequences. A mixed mode indicator signal (DCOC MM indicate) 306 is generated by the DCOC sequence manager 228 and communicates to the CD state machine 240 when the DCOC sequences begin and end. The logic high state (1) of the mixed mode indicator signal 306 begins at event "A" when the DCOC starts, and becomes a logic low state (0) at event "G" synchronous with termination of the DCOC.

After the mixed mode DCOC sequence is completed at time "G," the final value of the IIR filter 216 (FHP3) may be used as a seed value once a CD trigger event is initiated. Alternatively, the seed value may be calculated using a seed averager subroutine in which the seed value is equal to the average value calculated from a predefined number of receive samples after time "G" the CD trigger event reconfigures intra-stage operating parameters, assuming a speaker unmute sequence will be initiated. This is done so as to minimize DC transients that may otherwise induce audio distortion artifacts. In order to minimize "falsing" of the CD algorithm, offset timers are used to control the CD processing relative to the mixed mode DCOC.

To avoid contention between the host controller 160 and the CD state machine 240, the Rx output interface block 224 is activated only when the host controller 160 asserts an Rx Enable signal. This means a carrier detect "wake up" is sent to the host controller 160 using a physically separate pin. When the post ADC digital processing and formatting block 116 is in an autonomous mode, a CD flag connected to the host controller 160 serves to trigger SSI processing. The host controller 160 then asserts the Rx Enable signal to receive SSI samples. Once the DSP 150 and host controller 160 begin processing the SSI samples, all software routines needed to control steady state and/or dynamic DCR operation can be enabled without regard to the CD flag. When in autonomous mode, the logic state of the carrier detect pin is also available at the SSI output for some SSI configurations. The bit logic follows the logic level for the CD flag set signal 312.

Turning back to FIG. 3, the CD state machine 240 may "wake up" at any time during the DCOC sequencing, as long as there is sufficient time to initialize the CD algorithm block 242 and set the CD transition trigger block 244 prior to completion of the DCOC sequence. As shown, the CD set trigger signal 310 indicates when the CD state machine 240 first initializes its internal blocks, including CD algorithm block 242 and CD feedback sequencer block 246. The CD hold off timer signal 308 corresponds to a suspend timer signal generated from the CD transition trigger block 244 of the CD state machine 240. The hold off timer signal 308 is continuously low throughout the mixed mode DCOC sequence and is used to suspend processing of the sampled received signal by the DCOC block 220 and CD algorithm block 242, and ensure that the speaker of the receiver 100 remains muted until the hold off signal timer transitions high.

After the termination of the mixed mode DCOC sequence is indicated by the falling edge of the mixed mode indicator signal 306, the CD hold off timer signal 308 transitions high after a predetermined number of samples have elapsed, as shown at event "H" on the time axis 350. The time difference between event "G" and event "H" is known as the CD hold off time in which processing of samples by the DCOC block 220 is suspended until output samples from the IIR filter 216 are processed through any intermediate digital stages, such as the selectivity FIR filter 218. Once the CD hold off timer signal 308 transitions high at "H" of time axis 350, the CD state machine 240 begins processing of the sampled received signal from the output of the DCOC block 220.

After event "H," any received signal will be detected by the IQ CD algorithm block 242 and will trigger an ISR "wake up" sequence of any processors that may be in battery save mode. As shown, after an indeterminate period of time, an Rx burst signal 302 is received at the CD state machine 240 corresponding to event "I" on the time axis 350. The Rx burst signal 302 corresponds to an on-channel signal received by the antenna 102. Once the Rx burst 302 is detected, a CD flag set signal 312 is set to logic high. Setting the CD flag set signal 312 to logic high triggers an ISR signal from ISR sequence trigger 248, which "wakes up" the DSP 150 and host controller 160 from battery save mode. The processing blocks are activated as indicated by a DSP/host Battery Save signal 314 transitioning to logic high at event "I" on the time axis 350. The CD flag set signal 312 and the DSP/host battery save signal 314 remain active (logic high) for as long as the Rx burst 302 is present, as shown in FIG. 3, between events "I" and "J."

For the time period between events "I" and "J," the receiver is function in normal operation with sampled receive data signals being process by DSP/host processors. Synchronous with termination of the Rx burst 302 at event "J" on the time axis 350, the CD flag set signal 312 is set to logic low indicating the absence of any on-channel received signal. This operating state continues until a subsequent Rx burst is received, whereupon the CD flag set signal 312 transitions to logic high as previously described. As shown in FIG. 3, the second and final SPI CE pulse 304 is received at event "K" on the time axis 350. After receiving the final SPI CE pulse 304, the receiver is put into battery save, after which the various CD state machine 240 and DCOC sequence manager 228 signals are transitioned to logic low at various time intervals depending on internal variables within each subsystem block. Finally, at event "L," all major receiver systems are in battery save and all timing signals in FIG. 3 are at logic low.

As noted above, the CD digital section "wakes up" the DSP and host from a battery save mode. In addition, the CD State Machine 240 can be used in scan environments depending on the Host-DSP Hardware Abstraction Layer (HAL) structure. A receiver system is said to be in scan mode when the receiver continuously transitions through a predefined listing of RF channels (e.g.: scan list), pausing long enough at each channel to determine if an on-channel signal is present. If an on-channel signal is detected, the scan channel change sequencing is suspended and the receiver processes the received signal as normal. If no on-channel signal is detected, the receiver transitions to the next channel in the scan list. This scan channel change sequence continues until all channels in the scan list have been checked, at which point the scan sequence restarts at the beginning of the scan list.

A special case for scan mode is referred to as priority scan, wherein a single channel is designated as a priority channel, and a second channel(s) is designated as the non-priority channel. The receiver may operate in normal receive mode when on the non-priority channel for a set period of time. After the allocated time period has elapsed, the receiver transitions to the priority channel to check if there is an on-channel signal for the priority channel. The transition to the priority channel occurs regardless of whether the receiver is receiving a signal on the non-priority channel. If the receiver system determines that there is no on-channel signal for the priority channel, the receiver transitions back to the non-priority channel to resume normal receive operation. If the receiver detects an on-channel signal for the priority channel, the receiver stays on the priority channel and begins processing of the priority channel receive signal, even if staying on the priority channel means missing any remaining messages being transmitted on the non-priority channel. The serial transitioning between the priority and non-priority channel occurs at regular time intervals as may be set by the user of the receiver system.

If the DSP/host HAL supports tracking DCOC sequences using timers, and can therefore predict when to look at the SSI data representing the CD flag set signal 312 (assuming that the SSI is active in scan), then the CD State Machine 240 may be used in scan mode. Using the CD state machine 240 during scan requires proper configuration of CD state machine sub-blocks at each channel transition through proper application of the "reset" and "suspend" functions as has been previously described. The CD state machine functions to re-initiate a carrier detect sequence after each channel transition to determine if an on-channel signal is present without requiring the DSP to process the sampled received data. Once an on-channel signal is detected, the CD state machine triggers resumption of DSP processing of receive samples in a manner similar to the wake up sequence previously described for battery save operation (e.g.—using the ISR interface) or through the CD indicator data embedded in the SSI signal. Using the CD state machine minimizes latency in detecting an on-channel signal by removing DSP processing time.

Figure 4:
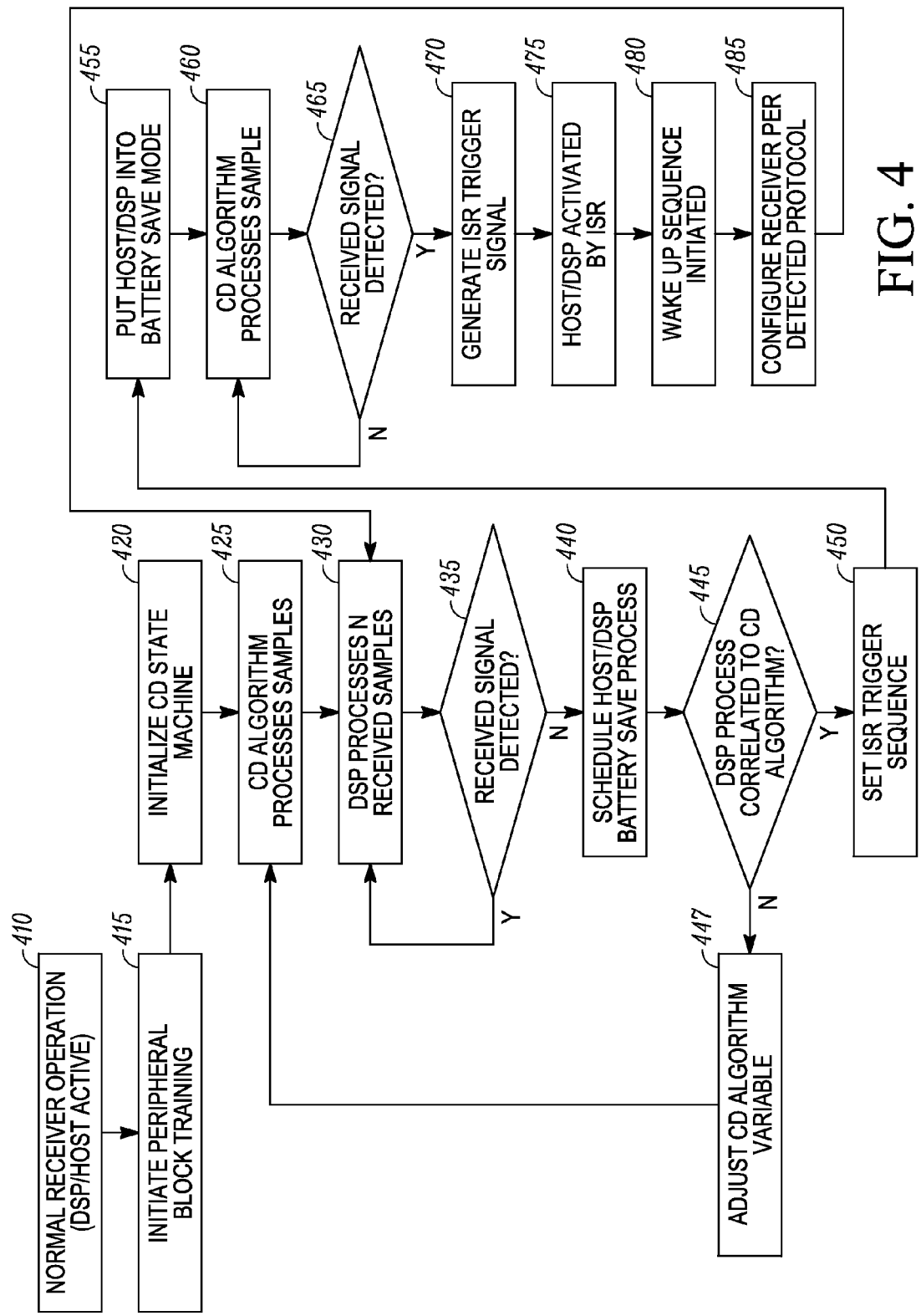
FIG. 4 illustrates an embodiment of a flow diagram of a method followed by the receiver of FIG. 1.

A flow diagram of a method for suspending DSP/host processing of received samples and a subsequent ISR wake-up sequence trigger from the CD state machine 240 once an on-channel signal is detected is shown in FIG. 4. The receiver 100 is operating normally while DSP/host processor 150/160 is processing samples of the received signal in block 410. To ensure optimum receive operation, periodic training sequences, such as the mixed mode DCOC sequences as described in relation to FIG. 3, may be performed in block 415. Following the training process, the CD state machine 240 is initialized and the complex IQ CD algorithm begins to process samples in blocks 420 and 425, respectively. The complex IQ CD algorithm processing in block 425 generates a first CD metric. During preceding process blocks, the DSP 150 continues to process sampled receive data provided to it through the SSI interface. After the CD algorithm has processed sufficient samples to make a carrier detect determination at block 425, the DSP 150 processes N received samples to generate a second CD metric indicating the presence of a received signal at block 430. Once the DSP 150 has generated a CD metric from N received samples, a decision is made at block 435 to determine if a received signal is present at the receiver 100. If it is determined that a received signal is present at block 435, the DSP 150 continues to process the received samples as may be appropriate for proper operation of the receive system. Continuous iterations of blocks 430 and blocks 435 may result as long as a received signal is detected; therefore, all normal receive processes that may operate when receiving a signal are represented in blocks 430 and blocks 435.

The decision at block 435 may be based on the CD state machine-generated first CD metric from block 425 or on the DSP-generated second CD metric from block 430. If no received signal is detected at block 435, the DSP/host 150/160 processors may schedule battery save processes to minimize active executable subroutines, including peripheral support, battery saving external sub-blocks and reduced processing of the received samples at block 440. However, prior to going into battery save mode, the DSP 150 may correlate the first CD metric from the CD state machine 240 to the second CD metric generated internally by the DSP 150 at decision block 445. If the first CD metric does not correlate to the second CD metric within predefined acceptable tolerance limits, then the DSP 150 may decide to adjust some of the algorithm variables to control the accuracy of the complex IQ CD algorithm processes at block 447. In this disclosure, the terms "tolerance limit" and "correlation threshold" are understood to have the same meaning. Typically, a tolerance limit for correlation between a first and second CD metric may be expressed in terms of percentage difference between the particular CD metrics, with an acceptable correlation threshold being scaled to various levels depending on RF channel operating environments or received signal characteristics. For example, if no on-channel carrier is detected, then a high correlation threshold may be selected requiring a 99% equivalence between the first CD metric from the CD state machine 240, and the second CD metric from the DSP 150. The threshold may also require 99% correlation to N past CD metrics generated from N time periods, where N is as an integer set by the receive system operator. However, if a weak on-channel signal is detected (exhibiting a low SNR as measured by the DSP), then the tolerance limit for correlation between the first and second CD metric may be adjusted to a lower high correlation threshold, e.g., 95%. Alternatively, if an on-channel signal having high frequency deviations in the modulated received signal (as measured by the DSP 150) is detected, then a moderate correlation threshold of 80% to 90% may be selected.

If the first CD metric generated by CD state machine 240 does not meet the correlation threshold to the second CD metric generated by the DSP 150, the DSP/host 150/160 may elect to adjust variables effecting the processing of the received samples within complex IQ CD algorithm block 242 at block 447. The complex IQ CD algorithm block variables that may be adjusted include, for example, CD block size or observation period, smoothing coefficients, zero crossing threshold per block, CD prediction step, and CD threshold for carrier/no-carrier present determination. CD block size is defined as the number of received samples that may be used to determine a CD metric; therefore, block size is related to time by the input sample rate to CD state machine 240. CD threshold is the CD metric value that must be met to initiate an event. The CD zero crossing is a value generated within the CD algorithm block 242 that provides the number of zero crossings between contiguous samples (e.g., transition from a positive value to a negative value, or from a negative value to a positive value) that occurs within a given block size. A prediction step is explained in detail in U.S. patent application Ser. No. 12/257,672, above. A smoothing coefficient is a scaling factor that reduces variations between CD metric estimates generated within the IQ CD algorithm block 242.

After the CD algorithm variables have been adjusted at block 447, the process returns to block 425, where the CD algorithm regenerates the first CD metric for the CD state machine 240. After the first CD metric has been regenerated, new samples are processed by DSP 150 at block 430 to regenerate the second CD metric. A new comparison between the regenerated first and second CD metrics is subsequently accomplished at block 445. This iterative process can be repeated until correlation is achieved between the first and second CD metric within tolerance limits. In this way blocks 445, 447, and blocks 425 to 445 may form an internal "calibration loop" for the CD metric generation thereby permitting the CD metric generated by the CD state machine 240 to agree with the internal DSP CD metric decision. This calibration is generally completed prior to putting the DSP/host 150/160 and other sub blocks into battery save mode so as to ensure the accuracy of the CD state machine 240 operations.

Once the first and second CD metrics have been correlated, the ISR sequence trigger is armed at block 450 and the DSP/host 150/160, and any associated peripherals are placed into battery save mode at block 455. While the DSP/host 150/160 is in battery save mode, the CD algorithm continues to process samples of the received signal at block 460 and determine if there is a received signal present at decision block 465. Blocks 460 and 465 form a continuous monitoring process where sampled receive data is monitored for the presence of a received signal while the DSP/host 150/160 is in battery save mode. Once a received signal is detected, as indicated by the CD algorithm CD metric at block 465, the ISR trigger signal is generated at block 470. The ISR trigger signal activates the DSP/host 150/160 processes at block 475 and a wake up sequence is initiated at block 480 to return the DSP/host 150/160 to normal operating states. Once the DSP/host 150/160 have resumed normal operations, the DSP 150 resumes processing samples of the received signal and determines the appropriate receiver configuration (i.e., the configuration is protocol-specific) based on the processing of these received samples at block 485. Following initial DSP processing of the sampled received signal at block 485, the receiver 100 commences normal receiver operations at block 430 whereupon further DSP processing may be warranted. Alternatively, following initial DSP processing of the sampled received signal at block 485, the method may return to block 410.

Note that for nominal operation using the CD algorithm, the method of FIG. 4 is an endless loop. This loop is terminated when the CD algorithm/CD state machine 240 is disabled, the receiver 100/post ADC processing block 116 is turned off, or when in transmit mode and the receiver is in a special feedback mode.

Figure 5:
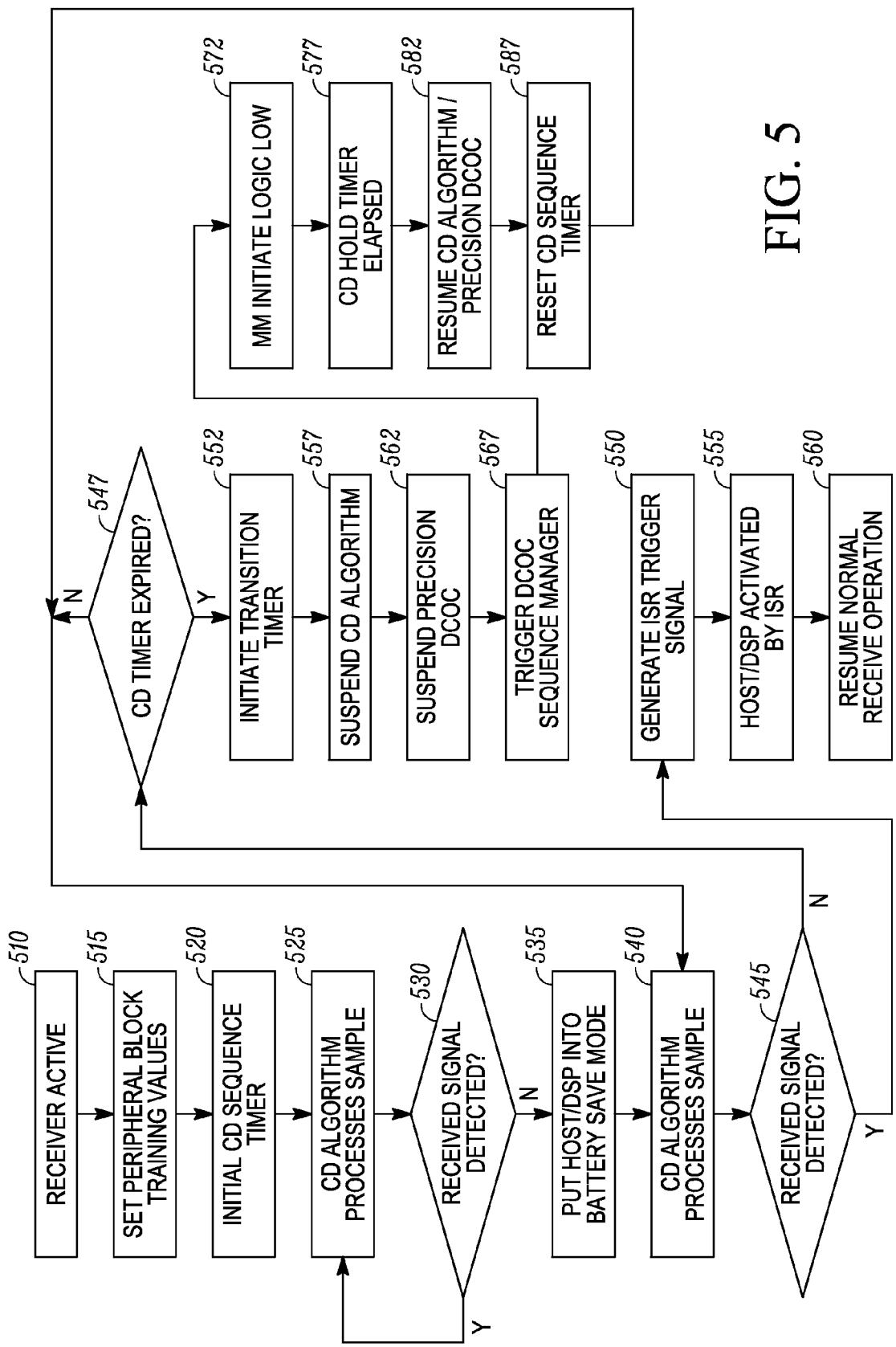
FIG. 5 illustrates an embodiment of a flow diagram of another method followed by the receiver of FIG. 1.

The flow diagram presented in FIG. 5 illustrates a method for suspending and retriggering digital processing of received samples by the CD state machine 240 relative to training sequences to eliminate undesired distortion artifacts. While the flowchart of FIG. 5 may include some or all portions of the flowchart of FIG. 4, the flowchart of FIG. 5 also illustrates how the CD state machine 240 is used to trigger and control ancillary training process used for proper receive operation while the DSP/host 150/160 remains in battery save mode. Beginning at block 510, the receiver 100 is active and operating normally, sampling received signals for further processing by the DSP/host 150/160. During normal receive operations, any receive stage that uses periodic training has its respectively training sequence initialized at block 515. The variables initialized at block 515 include DCOC sequence manager timers and iterations sequences as previously described in reference to FIG. 3.

Once the peripheral blocks have been initialized, the CD sequence timer is initialized in block 520. The CD sequence timer is used to autonomously trigger a training sequence of peripheral receiver blocks to maintain optimum receive functionality. The sequence timer may be apart of the CD feedback sequencer block 246 within the CD state machine 240 or may be an independent sample counter (not shown in FIG. 2) that counts contiguous samples as they are processed within the CD state machine 240.

At block 525, the complex IQ CD algorithm processes received samples. It is then determined whether or not a carrier is present at block 530. As long as a received signal is detected, the CD algorithm continuously processes received samples. Once it is determined at block 530 that there is no received signal present, the DSP/host 150/160 is placed in battery save mode at block 535 while the CD state machine continues to process received samples at block 540. A CD metric is produced at block 540 for each contiguous group of N samples and a determination is made at block 545 whether a received signal is present. If a received signal is detected at block 545, then the ISR trigger signal is generated at block 550 and the DSP/host 150/160 is reactivated by the ISR at block 555, with normal receive operations commencing at block 560. Note that blocks 540, 545, 550, 555 and 560 of FIG. 5 generally describe the corresponding blocks 460, 465, 470, 475, 480 and 485 of FIG. 4.

If a receive signal is not detected at block 545, the CD state machine 240 may also check to determine if the sequence timer has expired at block 547. If insufficient time has elapsed since the previous training sequence, the CD sequence timer will not have expired and the CD state machine 240 resumes processing of received samples at the CD algorithm block 540. Once CD sequence timer has expired, the peripheral block training sequence is autonomously triggered. An example of a peripheral block training sequence includes the mixed mode DCOC sequence controlled by the DCOC Sequence Manager 228. To initiate a training sequence, the transition trigger is generated at block 552, which may suspend processing of sampled receive data within the CD state machine 240 by the CD algorithm at block 557. Other receive blocks not included in the CD state machine 240 may also be suspended from processing received samples at block 562, including the DCOC BLOCK 220 or other receive sub-blocks.

Once processing of received samples has been suspended for certain blocks, the transition trigger at 552 triggers a sequence manager to imitate an autonomous training sequence in block 567. While the autonomous training sequence is on-going, the CD state machine 240 continues to suspend further processes until completion of the training sequence as indicated by the mixed mode indicator signal 306. Once the mixed mode indicator signal 306 indicates that the training sequence is complete in block 572, the CD state machine 240 waits until the CD hold off timer signal 308 has expired at block 577 before activating the CD algorithm and precision DCOC processing 200 at block 582. Once normal CD state machine 240 and receive operations have resumed following the peripheral block training, the CD sequence timer is reset at block 587 and normal monitoring of the receive channel resumes at block 540.

Turning to examples of the power savings, it is noted that the CD state machine 240 can be implemented in either hardware or software (e.g., stored in a memory in the receiver). However, implementing the CD state machine 240 solely in software may preclude turning off the DSP/host processing thereby precluding current drain reductions realized when putting the DSP/host 150/160 into battery save mode. By implementing the CD state machine 240 in dedicated hardware, battery savings in existing FM modes of up to 50% of standby current drain may be achievable without loss of capability by placing the DSP/host processor into a full deep sleep mode (similar to TDMA protocols) which eliminates DSP processing of SSI samples until it is known that an on-channel carrier is present. In some embodiments, this reduces DSP/host current drain from, for example, 20-40 mA to 500 uA. For a 5-5-90 duty cycle in FM operation (in which 90% of the time is spent in idle mode), this translates to approximately 40 min additional battery life for a 15% reduction in standby current drain.

It will be understood that the terms and expressions used herein have the ordinary meaning as is accorded to such terms and expressions with respect to their corresponding respective areas of inquiry and study except where specific meanings otherwise have been set forth herein. Relational terms such as first and second and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

It will be appreciated that some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein.

In various embodiments, the disclosed methods may be implemented as a computer program product for use with a computer system. Such implementations may include a series of computer instructions fixed either on a tangible medium, such as a computer readable medium (e.g., a diskette, CD-ROM, ROM, or fixed disk) or transmittable to a computer system, via a modem or other interface device, such as a communications adapter connected to a network over a medium. The medium may be either a tangible medium (e.g., optical or analog communications lines) or a medium implemented with wireless techniques (e.g., microwave, infrared or other transmission techniques). The series of computer instructions embodies all or part of the functionality previously described herein with respect to the system. Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies. It is expected that such a computer program product may be distributed as a removable medium with accompanying printed or electronic documentation (e.g., shrink wrapped software), preloaded with a computer system (e.g., on system ROM or fixed disk), or distributed from a server or electronic bulletin board over the network (e.g., the Internet or World Wide Web). Of course, some embodiments of the invention may be implemented as a combination of both software (e.g., a computer program product) and hardware. Still other embodiments are implemented as entirely hardware, or entirely software (e.g., a computer program product).

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure.

This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

Those skilled in the art will recognize that a wide variety of modifications, alterations, and combinations can be made with respect to the above described embodiments without departing from the spirit and scope of the invention defined by any claims issuing hereinfrom, and that such modifications, alterations, and combinations are to be viewed as being within the inventive concept. Thus, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the issuing claims. The invention is defined solely by the issuing claims including any amendments made and all equivalents of those claims.

The invention claimed is:

1. A receiver comprising:
   a mixer configured to down convert an analog signal from a higher frequency to a lower frequency;
   an analog processing block containing gain and filter stages configured to operate on the down converted analog signal;
   an analog-to-digital converter (ADC) configured to digitize the signal from the analog processing block;
   a digital processing and formatting (DPF) block configured to process and format the digitized signal, the DPF block comprising:
      a DC Offset Correction (DCOC) block configured to provide DC offset correction of residual DC distortion artifacts,
      a carrier detect (CD) state machine,
      a DCOC sequence manager responsive to the CD state machine and configured to control digital training sequences, and
      a sequence trigger responsive to the CD state machine; and
   a digital signal processor (DSP) configured to demodulate and arithmetically process samples from the DPF block; and
   a host controller configured to receive signals from the DSP and adjust parameters to an earlier stage of the receiver, processing by the DSP and host controller configured to be suspended and restarted by the sequence trigger depending on whether or not an on-channel signal is detected as having been received by the receiver.

2. The receiver of claim 1, wherein the receiver is a direct conversion receiver (DCR).

3. The receiver of claim 1, wherein the sequence trigger communicates with the DSP and the host controller through an Interrupt Service Request (ISR) interface between stages of the receiver embedded in the DPF block and the DSP and host controller.

4. The receiver of claim 1, further comprising a serial port interface (SPI) between the DPF block and the DSP and host controller, blocks within the DPF block configured by the host controller using the SPI to preprogram timer values, bandwidth and gain settings, and sequence configurations.

5. The receiver of claim 1, further comprising a Synchronous Serial Interface (SSI) between the DPF block and the DSP and host controller, wherein CD state machine status information is communicated to the DSP and host controller over the SSI.

6. The receiver of claim 1, further comprising an adjustable gain amplifier that amplifies an analog signal supplied to the ADC, the adjustable gain amplifier controlled by an automatic gain control (AGC) controller, a signal from the DCOC sequence manager dynamically controlling the AGC controller.

7. The receiver of claim 6, wherein when the DCOC sequence manager controls execution of the training sequence, the DCOC sequence manager also controls the AGC controller to engage maximum attenuation of the analog signal.

8. The receiver of claim 1, wherein the CD state machine comprises:
   a transition trigger,
   a CD feedback sequencer, and
   a CD algorithm block configured to receive a signal from the DCOC block to determine whether the on-channel signal is present and produce a CD metric that indicates whether the on-channel signal is present, the CD metric used to execute a sequence through the sequence trigger if the on-channel signal is detected and, through the CD feedback sequencer and transition trigger, initiate the training sequence to train the receiver if the on-channel signal is not detected.

9. The receiver of claim 8, wherein the CD feedback sequencer initiates the training sequence when the CD metric indicates the absence of the on-channel carrier, when the receiver changes channels, when a device containing the receiver transitions from transmit operation to receive channel monitor, or at protocol-specific Time Division Multiplex (TDM) slot periods having no information for the receiver.

10. The receiver of claim 8, wherein the transition trigger is configured to suspend processing of a received sample by the CD algorithm block and update suspend timer information into the DCOC block and the CD algorithm block to initiate the training sequence, the suspend timer information containing the period of time during which processing at the DCOC block and the CD algorithm block is suspended, normal processing of the received sample resumes after the period of time defined by the suspend timer has elapsed.

11. The receiver of claim 10, wherein suspend timer information is modifiable for each block in the receiver having a suspend timer.

12. The receiver of claim 10, wherein the CD state machine is configured to wait until a predetermined hold-off timer has expired after the period of time defined by the suspend timer has elapsed before activating the CD algorithm block to continue normal processing of the received sample.

13. The receiver of claim 1, wherein the DCOC sequence manager is responsive to the CD state machine and configured to control mixed mode analog and digital training sequences that serially correct DC offset errors in both an analog and digital received signal path.

* * * * *